(12) United States Patent
Chung et al.

(10) Patent No.: US 7,714,848 B2
(45) Date of Patent: May 11, 2010

(54) TOUCH SENSING APPARATUS

(75) Inventors: Shin-Hong Chung, Guangdong (CN);
Kuan-Hong Hsieh, Guangdong (CN);
Shi-Quan Lin, Guangdong (CN)

(73) Assignees: Hong Fu Jin Precision Industry (Shen Zhen) Co., Ltd., Longhua Town, Bao'an District, Shenzhen, Guangdong Province;
Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 479 days.

(21) Appl. No.: 11/309,158

(22) Filed: Jul. 3, 2006

(65) Prior Publication Data

US 2007/0074915 A1 Apr. 5, 2007

(30) Foreign Application Priority Data

Aug. 5, 2005 (CN) .................. 2005 1 0036409

(51) Int. Cl.
*G06F 3/041* (2006.01)
(52) U.S. Cl. ..................... 345/173; 178/18.06
(58) Field of Classification Search ......... 345/173–176; 178/18.01–18.06; 324/663; 307/116; 73/514.16; 341/33; 340/679
See application file for complete search history.

(56) References Cited

U.S. PATENT DOCUMENTS

| | | | | |
|---|---|---|---|---|
| 4,289,980 A | * | 9/1981 | McLaughlin | ................ 307/116 |
| 4,806,709 A | * | 2/1989 | Evans | ....................... 178/18.06 |
| 5,495,077 A | | 2/1996 | Miller et al. | |
| 5,565,625 A | * | 10/1996 | Howe et al. | .............. 73/514.16 |
| 5,783,875 A | * | 7/1998 | Jaros | .......................... 307/116 |
| 5,841,078 A | * | 11/1998 | Miller et al. | ............. 178/18.06 |
| 6,310,611 B1 | * | 10/2001 | Caldwell | ..................... 345/173 |
| 6,534,970 B1 | | 3/2003 | Ely et al. | |
| 6,545,614 B1 | * | 4/2003 | Kasai | .......................... 341/33 |
| 6,737,981 B2 | * | 5/2004 | Hagemeister et al. | ....... 340/679 |
| 2004/0155871 A1 | * | 8/2004 | Perski et al. | ................ 345/174 |

* cited by examiner

*Primary Examiner*—Amare Mengistu
*Assistant Examiner*—Premal Patel
(74) *Attorney, Agent, or Firm*—Winston Hsu

(57) ABSTRACT

A touch sensing apparatus includes: a differential signal source for generating two alternating current signals with same frequency and reverse phase; two conductors connected to a cathode output end and an anode output end of the differential signal source; a sensor for receiving a noise generated by a contact of an object; wherein the sensor and the two conductors form two simulated capacitors that result in offsetting environmental noise; a detector having a first input end and a second input end, the detector upon receiving the noise transferred from the sensor resulting in voltage differences between the first and second input ends thereof, and outputting a signal; and a rectifying circuit for rectifying the alternating current signals generated by the differential signal source and simultaneously generating a noise.

6 Claims, 1 Drawing Sheet

TOUCH SENSING APPARATUS

FIELD OF THE INVENTION

The present invention relates generally to touch sensing apparatuses such as those used in certain personal computers, and particularly to a touch sensing apparatus for sensing a noise generated by a user's touch.

DESCRIPTION OF RELATED ART

There are several available touch-sensing technologies that may be employed for use as a positional indicator in an apparatus such as a personal computer. Resistive-membrane positioning sensors are known and used in several applications. However, these sensors generally have poor resolutions. In addition, the sensors surface is exposed and thus subjected to wear and tear. Furthermore, resistive-membrane touch sensors are relatively expensive.

A touch sensitive control device translates touched locations into output signals. The device includes a substrate which supports a first and second interleaved, closely spaced, non-overlapping arrays of conductive plates. An insulating layer overlies the first and second arrays so that when the outer surface of the insulating layer is touched, the capacitance of at least one of the columns of plates of the first array and one of the rows of plates of the second array underlying the insulating layer at the location being touched exhibits a change of capacitance with respect to ambient ground. Based upon the measured capacitance of each column of the first array and row of the second array, a microcomputer produces output signals representing the coordinates of the location being touched. These output signals can be used, for example, to control a position of a cursor on a display screen of a personal computer or to make a selected function command.

In a second kind of conventional apparatus, a tablet for sensing the position of a stylus is provided. The stylus alters the transcapacitance coupling between a row and a column of electrodes that are scanned sequentially. In a third kind of conventional apparatus, a radial electrode arrangement is provided adjacent the space bar of a keyboard. The radial electrode arrangement is part of a trackball system, and can be activated by a user touching the trackball system with his/her thumb. This third kind of apparatus teaches the use of total touch capacitance as an indication of the touch pressure, in order to control the velocity of motion of a display screen cursor. Pulsed sequential polling is employed to address the effects of electrical interference.

What is still needed is a touch sensing apparatus with reduced circuitry complexity, low power consumption, improved sense accuracy, improved efficiency, and lower manufacturing costs.

SUMMARY OF INVENTION

A touch sensing apparatus is provided. A preferred embodiment of a touch sensing apparatus includes a differential signal source, two conductors, a sensor, a detector, and a rectifier circuit. The differential signal source is configured for generating two alternating current signals with same frequency and reverse phase. The two conductors are respectively connected to a cathode output end and an anode output end of the differential signal source. The sensor is located between the two conductors for receiving a noise generated by a contact of an object. The sensor and the two conductors form two simulated capacitors that result in offsetting environmental noise. A detector with a first input end and a second input end upon receiving the noise transferred from the sensor results in voltage differences between the first and second input ends thereof, and outputs a signal. The rectifying circuit is for rectifying the alternating current signals generated by the differential signal source and simultaneously generates a noise, wherein one end of the rectifier circuit is connected to the signal source and the other end of the rectifier circuit is connected to the second input end of the detector.

Other advantages and novel features will be drawn from the following detailed description of the preferred embodiment with reference to the attached drawings, in which:

DETAILED DESCRIPTION

Figure 1:
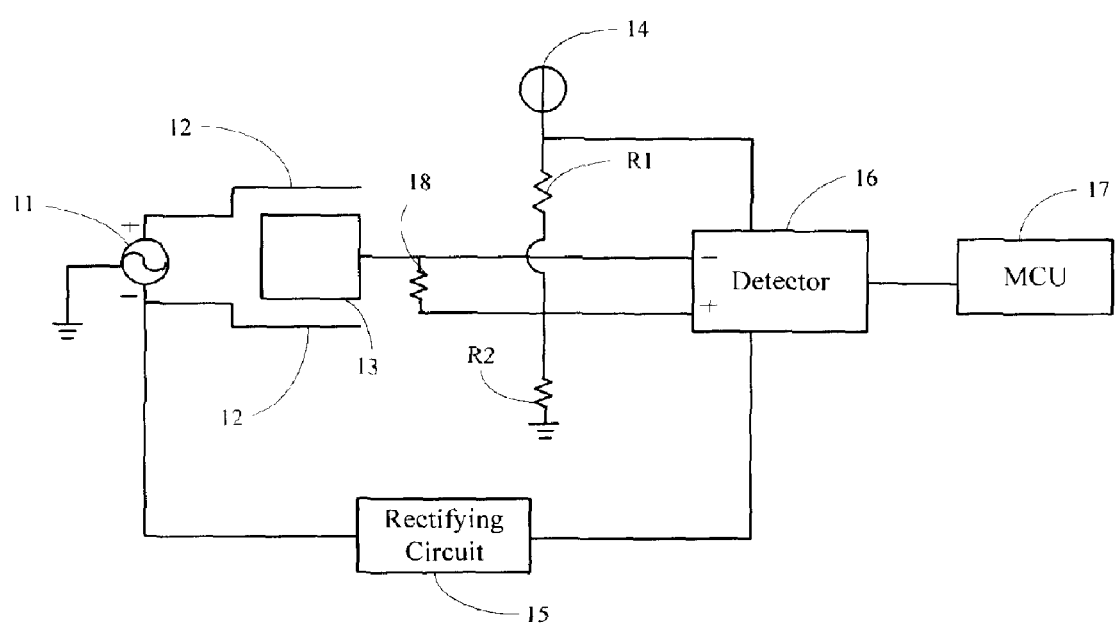
FIG. 1 is an exemplary circuit diagram of a touching sensing apparatus in accordance with a preferred embodiment of the present invention.

FIG. 1 is an exemplary circuit diagram of a touching sensing apparatus in accordance with a preferred embodiment of the present invention. The circuit mainly includes a differential signal source 11, two conductors 12, a sensor 13, a direct current power source 14, a rectifying circuit 15, a detector 16, a microcontroller unit (MCU) 17, and a load circuit 18. The differential signal source 11 has a cathode output end and an anode output end. The cathode output end and the anode output end connect to the corresponding conductors 12. The sensor 13 is located between the two conductors 12, and forms two simulated capacitors with the two conductors 12, wherein the two simulated capacitors are parallelly connected with each other and the connection point is located on the sensor 13. The sensor 13 is further connected to a first input end (symbolically labeled as "−") of the detector 16.

The direct current power source 14 is connected to a second input end (symbolically labeled as "+") of detector 16 by a first resistance R1, and provides a biased voltage for the detector 16. The direct current power source 14 is also connected in parallel to a positive power input end of the detector 16, and provides positive power source for the detector 16.

One end of the first resistance R1 connects to the direct current power source 14. The other end of the first resistance R1, as well as one end of a resistance R2, is connected to the second input end of the detector 16. The other end of the resistance R2 is grounded.

By utilizing the first and second resistances R1 and R2, a voltage of the first input end of the detector 16 is designed to be equal to a voltage of the second input end of the detector 16, thereby obtaining a balance state of the circuit, namely there is no signal flowing from the detector. During the balance state, voltages of the first input end and the second input end of the detector 16 are relatively the same.

One end of the rectifying circuit 15 is connected to the differential signal source 11 and the other end of the rectifying circuit 15 is connected to a negative power input end of the detector 16. The MCU 17 is connected to an output end of the detector 16. The load circuit 18 connects the first and second input ends of the detector 16. In this embodiment, the load circuit 18 may be a resistor.

The signal source 11 is for generating two alternating current signals with same frequency and reverse phase, and for outputting the two alternating current signals through a cathode output end and an anode output end.

An environmental noise is offset by the two simulated capacitors formed by the two conductors 12 and the sensor 13 so as to have the touch sensing apparatus undisturbed by the environmental noise. The circuit is in the balance state when no object is in contact with the sensor 13. Generally, an electrically charged body can generate an alternating magnetic field. When the object moves into an environment consisting the electrically charged body, the object generates noise.

When the object is in an environment without the electrically charged body, the object can not generate the noise. The differential signal source 11 provides the alternating magnetic field for the circuit, thus, the alternating magnetic field allows the object to generate noise not only in the environment with the electrically charged body but also in the environment without electrically charged body.

Therefore, when any object touches the sensor 13, noise flows to the sensor 13, a dielectric constant between the conductor 12 and the sensor 13 is increased. Due to the noise and the increased dielectric constant, the capacitance of the simulated capacitor is also increased. Consequently, the noise of the object flows through the senor 13, simultaneously, the voltage of the first input end of the detector 16 becomes greater than the voltage of the second input end of the detector 16, resulting an unbalanced state of the circuit.

In the unbalanced state, the detector 16 generates and amplifies a signal to the MCU 17 to perform a corresponding control. The detector 16 has a high input impedance, so as to easily detect the signal received from the input ends of the detector 16. The rectifying circuit 15 rectifies the alternating current signal generated by the signal source 11 as a negative power source for the detector 16 and generates a new noise simultaneously. The new noise affects a peripheral environment of the touch sensing apparatus. Consequently, the overall noise of the object is increased also. When any object touches the sensor 13, the noise flowing to the sensor 13 is increased, thereby obtaining a more accurate sensitivity. When the sensor 13 is touched, the load circuit 18, the object, and the ground form a loop circuit, improving the sensitivity of the sensor 13.

Although the present invention has been specifically described on the basis of a preferred embodiment, the invention is not to be construed as being limited thereto. Various changes or modifications may be made to the embodiment without departing from the scope and spirit of the invention.

What is claimed is:

1. A touch sensing apparatus comprising:
    a differential signal source configured for generating two alternating current signals with same frequency and reverse phase, wherein the differential signal source comprises a cathode output end and an anode output end;
    two conductors respectively connected to the cathode output end and the anode output end of the differential signal source;
    a sensor located between the two conductors for receiving a noise;
    wherein the sensor and the two conductors form two simulated capacitors that offset environmental noise;
    a detector having a first input end and a second input end, the detector upon receiving the noise transferred from the sensor resulting in voltage differences between the first and second input ends thereof, and outputting a signal;
    a rectifying circuit for rectifying the alternating current signals generated by the differential signal source, simultaneously generating a noise, wherein an end of the rectifier circuit is connected to the signal source and another end of the rectifier circuit is connected to the second input end of the detector;
    a direct current power source electrically connected to the second input end and a positive power input end of the detector, and configured for providing a bias voltage for the detector; and
    a first resistance and a second resistance, wherein one end of the first resistance connects to the direct current power source, the other end of the first resistance, as well as one end of the second resistance, is connected to the second input end of the detector, the other end of the second resistance is grounded.

2. The touch sensing apparatus as described in claim 1, further comprising a load circuit connected between the first input end and the second input end of the detector.

3. The touch sensing apparatus as described in claim 1, further comprising a microcontroller unit (MCU) for processing signals outputted by the detector.

4. The touch sensing apparatus as described in claim 1, wherein the detector comprises a relatively high input impedance.

5. The touch sensing apparatus as described in claim 1, wherein the differential signal source further provides an alternating magnetic field for the touch sensing apparatus.

6. The touch sensing apparatus as described in claim 1, wherein the two simulated capacitors formed by the sensor and the two conductors are connected with each other parallelly.

* * * * *